United States Patent
Erhardt

(10) Patent No.: US 7,143,370 B1
(45) Date of Patent: Nov. 28, 2006

(54) PARAMETER LINKING SYSTEM FOR DATA VISUALIZATION IN INTEGRATED CIRCUIT TECHNOLOGY DEVELOPMENT

(75) Inventor: Jeffrey P. Erhardt, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 275 days.

(21) Appl. No.: 10/460,500

(22) Filed: Jun. 11, 2003

(51) Int. Cl.
*G06F 17/50* (2006.01)
(52) U.S. Cl. .............................. 716/4; 716/5
(58) Field of Classification Search ............ 716/4, 716/5
See application file for complete search history.

(56) References Cited

U.S. PATENT DOCUMENTS 6,542,830 B1 * 4/2003 Mizuno et al. ............... 702/35
2004/0002829 A1 * 1/2004 Iguchi et al. ............... 702/118

* cited by examiner

*Primary Examiner*—Sun James Lin
(74) *Attorney, Agent, or Firm*—Mikio Ishimaru

(57) ABSTRACT

A system for presenting tester information is provided, including providing test data of a first parameter and generating a first type of visualization of the first parameter and presenting the first type of visualization of the first parameter. The system includes generating a second type of visualization of the first parameter in response to the presenting of the first type of visualization of the first parameter and presenting the second type of visualization of the first parameter.

20 Claims, 4 Drawing Sheets

PARAMETER LINKING SYSTEM FOR DATA VISUALIZATION IN INTEGRATED CIRCUIT TECHNOLOGY DEVELOPMENT

BACKGROUND

1. Technical Field

The present invention relates generally to semiconductor technology and more specifically to semiconductor research and development.

2. Background Art

At the present time, electronic products are used in almost every aspect of life, and the heart of these electronic products is the integrated circuit. Integrated circuits are used in everything from airplanes and televisions to wristwatches.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the total number of integrated circuits formed on the wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers on processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes, but only a few wafers are processed to reduce cost. The research and development environment has resulted in the generation of tremendous amounts of data and analysis for all the different processes and variations. This, in turn, has required a large number of engineers to do the analysis. With more data, the answer always has been to hire more engineers.

However, this is not an acceptable solution for major problems.

The problems include, but are not limited to, the difficulties inherent when multiple visualizations are performed at once. The multiple visualizations are inaccurate, inefficient, and time consuming when trying to match more than a few parameters involved individually.

The problems include, but are not limited to, trying to systematically and statistically generate optical proximity correction (OPC) information.

The problems include, but are not limited to, the need to detect marginally printing reticle defects.

The problems include, but are not limited to, enabling Icc leakage testing with a few pins to allow easy bench characterization of flash arrays.

Solutions to these problems have been long sought but prior developments have not taught or suggested any solutions and, thus, solutions to these problems have long eluded those skilled in the art.

DISCLOSURE OF THE INVENTION

The present invention provides a system for presenting tester information including providing test data of a first parameter and generating a first type of visualization of the first parameter and presenting the first type of visualization of the first parameter. The system includes generating a second type of visualization of the first parameter in response to the presenting of the first type of visualization of the first parameter and presenting the second type of visualization of the first parameter. This system allows multiple visualizations of die level and wafer level data to be displayed simultaneously in a highly accurate, efficient, and expeditious manner to match a plurality of different parameters.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
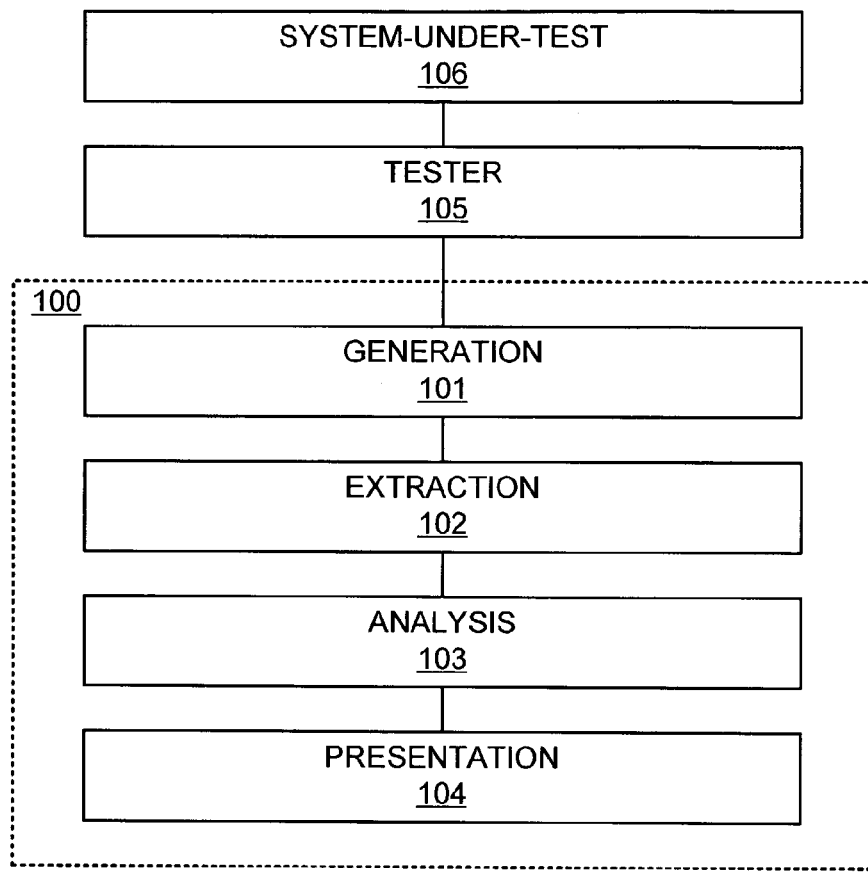
FIG. 1 is a block diagram of a tester information processing system according to the present invention.

Referring now to FIG. 1, therein is shown a block diagram of a tester information processing system 100 according to the present invention. The tester information processing system 100 is the result of the discovery that at times a single fundamental block can solve the problems presented but often there are four fundamental blocks to solving the problems presented.

The four fundamental blocks are a generation block 101, an extraction block 102, an analysis block 103, and a presentation block 104. Each of the blocks can stand independently in the tester information processing system 100, and within these blocks are various commercially available techniques, methodologies, processes, and approaches as well as the invention disclosed herein. The four fundamental blocks are discussed in the approximate chronology that the blocks are used in the tester information processing system 100.

The tester information processing system 100 includes various pieces of commercially available production, test, research, and development semiconductor equipment, specialized circuitry, and/or computers, which operate on and manipulate information and/or data, which are generically defined herein as "information". The tester information processing system 100 receives information from a tester 105, which is connected to a system-under-test 106.

In the integrated circuit field, the tester 105 can be a semiconductor test system for testing wafers or die and the system-under-test 106 can be anything from a complete wafer down to an element of an individual semiconductor device on a die.

In the generation block 101, basic information is generated looking at new and old products, new and old processes, product and process problems, unexpected or unpredictable results and variations, etc. Generation of the information may use the tester 105 itself, a conventional test information, a personal computer, etc. It may also require new equipment and/or methods, which are described herein when required.

In the extraction block 102, usable information is extracted from the generated information from the generation block 101. Essentially, the generated information is translated into more useful forms; e.g., broken apart so it can be reassembled in different forms to show different interrelationships.

For example, most testing equipment provides raw data in massive test files. Sometimes, millions of measurements provide millions of pieces of information, which must be digested and understood. The test files seldom have a user-friendly tabular output of parameter and value. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

In the analysis block 103, the usable information from the extraction block 102 is analyzed. Unlike previous systems where a few experiments were performed and/or a relatively few data points determined, the sheer volume of experiments and data precludes easy analysis of trends in the data or the ability to make predictions based on the data. Analysis of the extracted information may also require new equipment and/or methods, which are described herein when required.

In the presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. In some cases, problems cannot even be recognized unless the information is presented in an easily understood and digested form, and this often requires new methods of presentation, which are described herein when required.

Figure 2A:
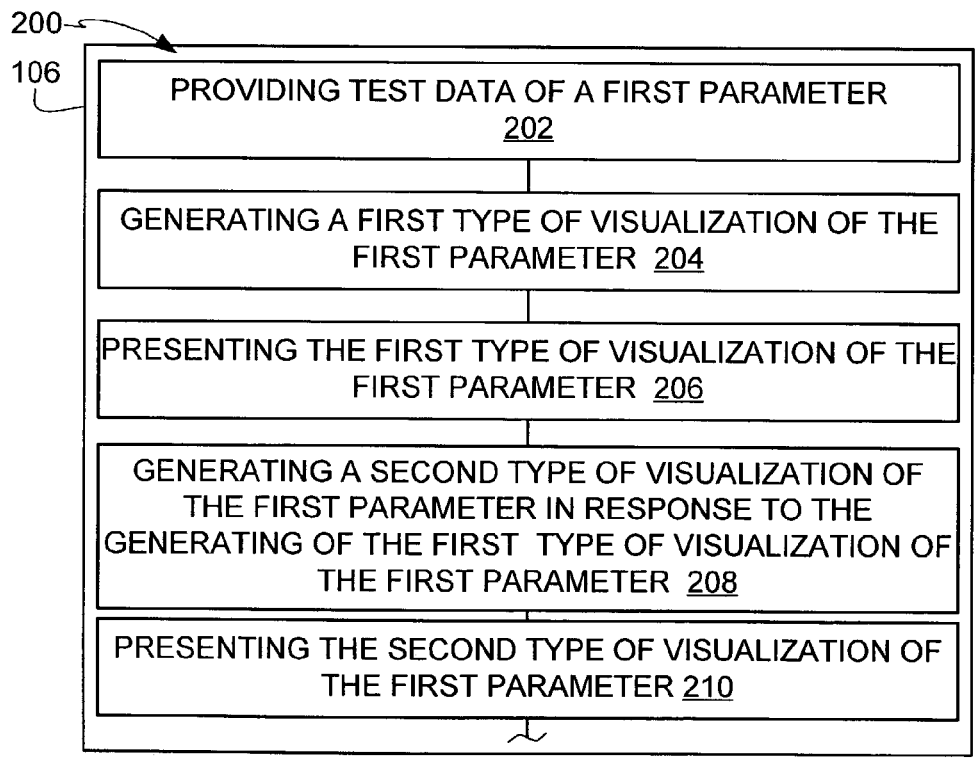
FIGS. 2A and 2B is the presentation block of the present invention with a system of a parameter linking method in accordance with the present invention.
Figure 2B:
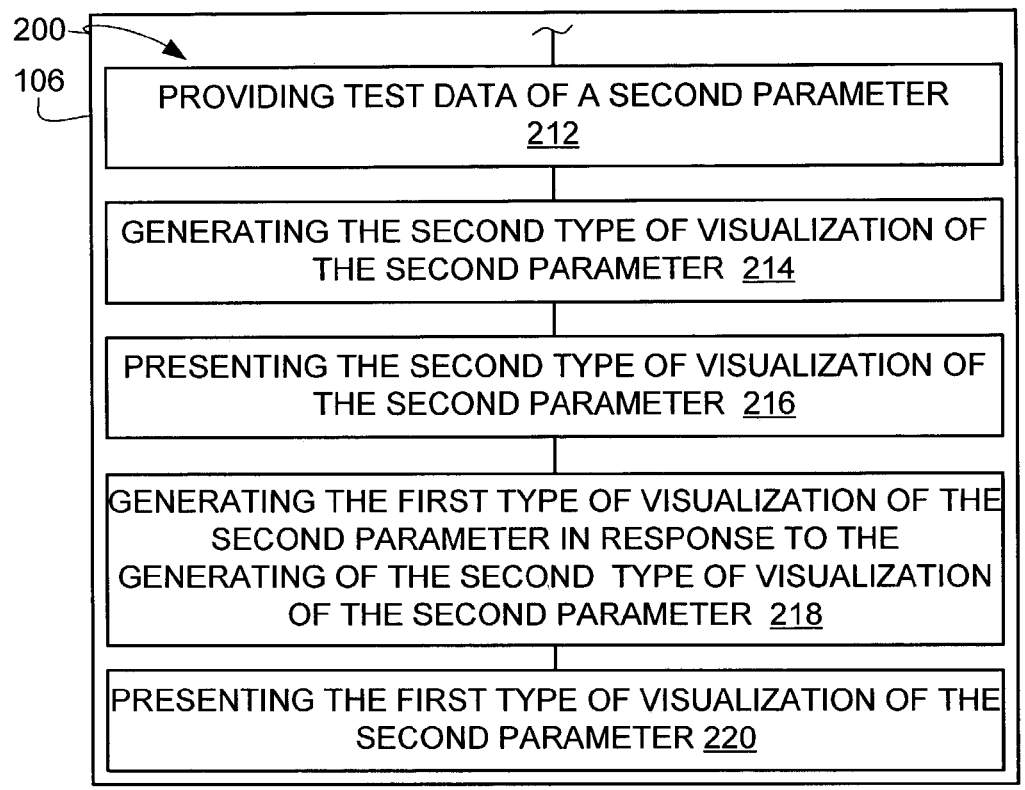

Referring now to FIGS. 2A and 2B, therein is shown the presentation block 104 having a system 200 of a parameter linking method for data visualization and graphing.

The system 200 includes: a step 202 of providing test data of a first parameter; a step 204 of generating a first type of visualization of the first parameter; a step 206 of presenting the first type of visualization of the first parameter; a step 208 of generating a second type of visualization of the first parameter in response to the generating of the first type of visualization of the first parameter; and a step 210 of presenting the second type of visualization of the first parameter.

The present invention allows multiple visualizations to be performed at once in a highly accurate, efficient, and expeditious manner to match a number of different parameters.

The system 200 further includes: a step 212 of providing test data of a second parameter; a step 204 of generating the second type of visualization of the second parameter; a step 216 of presenting the second type of visualization of the second parameter; a step 218 of generating the first type of visualization of the second parameter in response to the generating of the second type of visualization of the second parameter; and a step 220 of presenting the first type of visualization of the second parameter.

The first and second parameters can relate to threshold voltages, device currents, and junction voltages, etc. The first and second visualizations can be of different types such as wafer maps, histograms, bar charts, box charts, etc. Further, the system 200 can be extended to optionally link any number or types of visualizations. It will be understood that the linkage can be to any number or types of parameters, such as symbol type, color, sizing, etc.

The system 200 can further be implemented in circuitry or a computer by providing circuits or programming for performing the functions described in each of the above steps.

Figure 3:
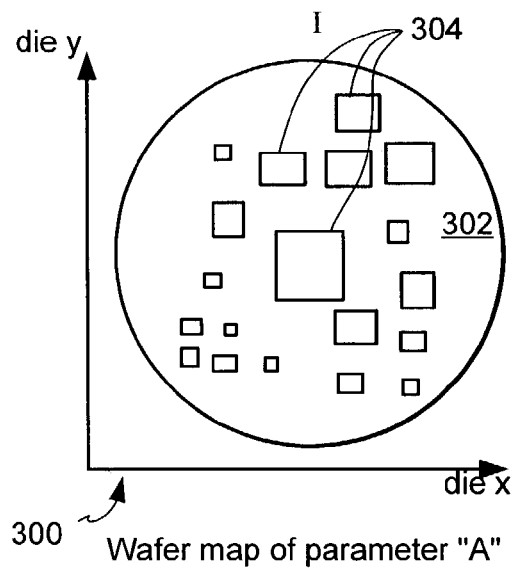
FIG. 3 is an example in accordance with the present invention.

Referring now to FIG. 3, therein is shown by way of example, a wafer map visualization 300 of a semiconductor wafer 302. The wafer map visualization 300 is of a parameter "A", such as threshold voltage values of semiconductor devices in areas 304.

Figure 4:
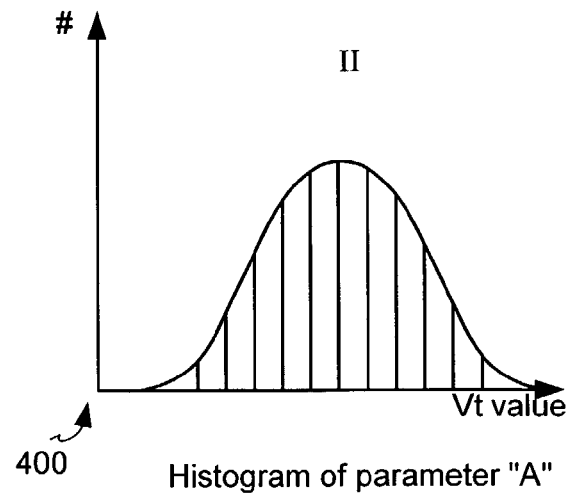
FIG. 4 is the example in accordance with the present invention.

Referring now to FIG. 4, therein is shown by way of example, a histogram visualization 400 of the parameter "A", such as threshold voltage values versus the number of semiconductor devices of each of the threshold voltage values.

In the present invention, there is a "link" between the first visualization of the wafer map visualization 300 of parameter "A", and the second visualization of the histogram visualization 400 of parameter "A".

This link may also be formed such that when a second visualization of a histogram of a second parameter "B" is generated or presented, the first type of visualization of a wafer map of the second parameter "B" is automatically generated.

The method of forming the link would be obvious to those having ordinary skill in the art based on the disclosure above.

Figure 5:
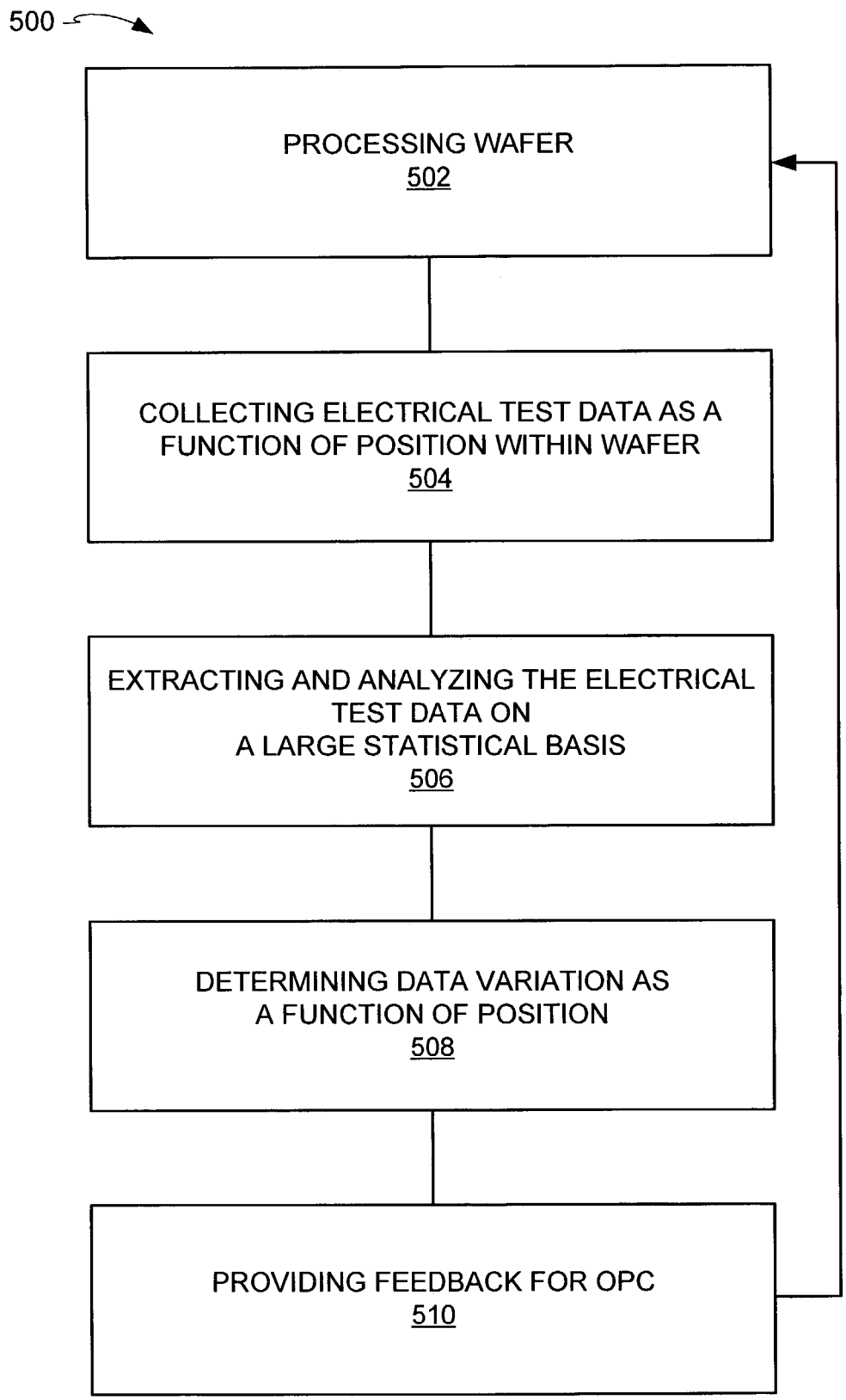
FIG. 5 is a simplified flow chart and a method for discerning electrical variation as a function of position on an array.

Referring now to FIG. 5, therein is shown a simplified flow chart 500 of a method for discerning electrical variation as a function of position on an array to systematically and statistically generate optical proximity correction (OPC) information.

The flow chart 500 includes a step 502 of processing a wafer; a step 504 of collecting the electrical data as a function of position within the wafer; a step 506 of extracting and analyzing the electrical test data on a large statistical basis; a step 508 of determining data variation as a function of position; a step 510 of providing feedback for OPC; and returning to the step 502 of processing another wafer.

The present invention allows the collection of more detailed data than can be collected manually in-line.

Figure 6:
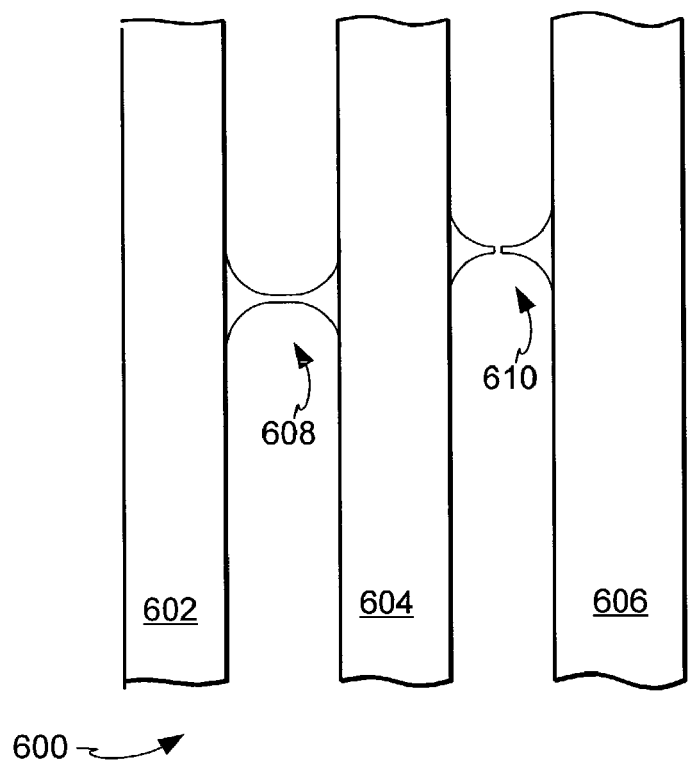
FIG. 6 is a plurality of lines in accordance with the present invention.

Referring now to FIG. 6, therein is shown a number of word lines 600, made up of word lines 602, 604, and 606, for a memory device (not shown).

Between the word lines 602 and 604 is a printing defect 608, and between the word lines 604 and 606 is a marginally printing defect 610, which may change as a function of exposure/focus.

Figure 7:
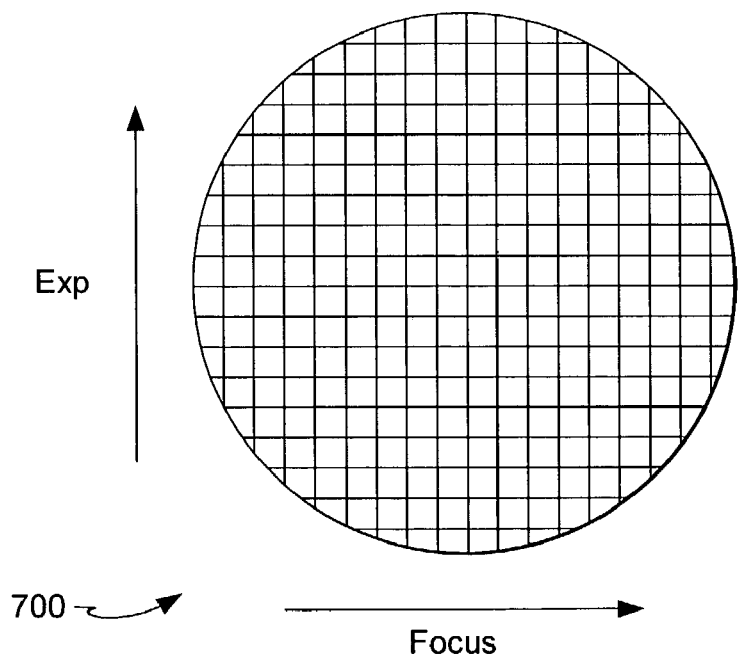
FIG. 7 is a focus exposure matrix in accordance with the present invention.

Referring now to FIG. 7, therein is shown a focus exposure matrix (FEM) 700. The FEM 700 involves sequentially exposing a series of areas of a semiconductor wafer with the pattern of a mask while exposure and focus values are incrementally changed from one exposure location to the next. This provides information of the combination of focus and exposure, which results in the best resolution on the wafer and can determine the marginality of marginally printing defect 610 at critical dimensions of the semiconductor wafer. Typically, a test wafer is exposed in a stepper while the focus is varied along one axis and the exposure is varied along the other. Thus, a matrix of images is obtained on the exposed wafer, wherein each exposure site has a different focus-exposure setting.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of presenting tester information comprising:
providing test data of a first parameter;
generating a first type of visualization of the first parameter;
presenting the first type of visualization of the first parameter;
generating a second type of visualization of the first parameter in response to the generating of the first type of visualization of the first parameter; and
presenting the second type of visualization of the first parameter.

2. The method as claimed in claim 1 additionally comprising:
providing test data of a second parameter;
generating the second type of visualization of the second parameter;
presenting the second type of visualization of the second parameter;
generating the first type of visualization of the second parameter in response to the generating of the second type of visualization of the second parameter; and
presenting the first type of visualization of the second parameter.

3. The method as claimed in claim 2 wherein the providing the first and second parameters provides parameters that are different.

4. The method as claimed in claim 1 wherein the generating the first and second types of visualization generates types of visualizations that are different.

5. The method as claimed in claim 1 wherein the generating the first and second visualizations provides visualizations that are different in symbol, color, sizing, and a combination thereof.

6. A method of presenting tester information comprising:
providing semiconductor wafer and die test data of a first parameter;
generating a first type of visualization of the first parameter;
presenting the first type of visualization of the first parameter;
generating a second type of visualization of the first parameter automatically in response to the generating or the presenting of the first type of visualization of the first parameter; and
presenting the second type of visualization of the first parameter.

7. The method as claimed in claim 6 additionally comprising:
providing semiconductor wafer and die test data of a second parameter;
generating the second or the first type of visualization of the second parameter;
presenting the second or the first type of visualization of the second parameter;
generating the first or the second type of visualization of the second parameter automatically in response to the generating or presenting of the respective second or first type of visualization of the second parameter; and
presenting the first or the second type of visualization of the second parameter respectively in response to the respective generating of the second or the first type of visualization of the second parameter.

8. The method as claimed in claim 7 wherein the providing the first and second parameters provides parameters selected from a group consisting of electrical, mechanical, spatial parameters, and parameters that are a combination thereof wherein the first parameter is different from the second parameter.

9. The method as claimed in claim 6 wherein the generating the first and second types of visualization generates types of visualizations selected from a group consisting of a map, graph, chart, and a combination thereof wherein the first visualization is different from the second visualization.

10. The method as claimed in claim 6 wherein the generating the first and second visualizations provides visualizations that are different in symbols, colors, sizes, shapes, and a combination thereof.

11. A system of presenting tester information comprising:
means for providing test data of a first parameter;
means for generating a first type of visualization of the first parameter;
means for presenting the first type of visualization of the first parameter;

means for generating a second type of visualization of the first parameter in response to the generating of the first type of visualization of the first parameter; and means for presenting the second type of visualization of the first parameter.

12. The system as claimed in claim 11 additionally comprising:

means for providing test data of a second parameter;

means for generating the second type of visualization of the second parameter;

means for presenting the second type of visualization of the second parameter;

means for generating the first type of visualization of the second parameter in response to the generating of the second type of visualization of the second parameter; and means for presenting the first type of visualization of the second parameter.

13. The system as claimed in claim 12 wherein the means for providing the first and second parameters provides parameters that are different.

14. The system as claimed in claim 11 wherein the means for generating the first and second types of visualization generates types of visualizations that are different.

15. The system as claimed in claim 11 wherein the means for generating the first and second visualizations provides visualizations that are different in symbol, color, sizing, and a combination thereof.

16. A system of presenting tester information comprising:

means for providing semiconductor wafer and die test data of a first parameter;

means for generating a first type of visualization of the first parameter;

means for presenting the first type of visualization of the first parameter;

means for generating a second type of visualization of the first parameter automatically in response to the generating or the presenting of the first type of visualization of the first parameter; and means for presenting the second type of visualization of the first parameter.

17. The system as claimed in claim 16 additionally comprising:

means for providing semiconductor wafer and die test data of a second parameter;

means for generating the second or the first type of visualization of the second parameter;

means for presenting the second or the first type of visualization of the second parameter;

means for generating the first or the second type of visualization of the second parameter automatically in response to the generating or presenting of the respective second or first type of visualization of the second parameter; and means for presenting the first or the second type of visualization of the second parameter respectively in response to the respective means for generating of the second or the first type of visualization of the second parameter.

18. The system as claimed in claim 17 wherein the means for providing the first and second parameters provides parameters selected from a group consisting of electrical, mechanical, spatial parameters, and parameters that are a combination thereof wherein the first parameter is different from the second parameter.

19. The system as claimed in claim 16 wherein the means for generating the first and second types of visualization generates types of visualizations selected from a group consisting of a map, graph, chart, and a combination thereof wherein the first visualization is different from the second visualization.

20. The system as claimed in claim 16 wherein the means for generating the first and second visualizations provides visualizations that are different in symbols, colors, sizes, shapes, and a combination thereof.

* * * * *